United States Patent
Dalla Libera et al.

[11] Patent Number: 6,097,057
[45] Date of Patent: Aug. 1, 2000

[54] MEMORY CELL FOR EEPROM DEVICES, AND CORRESPONDING FABRICATING PROCESS

[75] Inventors: Giovanna Dalla Libera, Monza; Bruno Vajana, Bergamo; Roberta Bottini, Lissone; Carlo Cremonesi, Vaprio D'Adda, all of Italy

[73] Assignee: SGS-Thomson Microelectronics S.r.l., Agrate Brianza, Italy

[21] Appl. No.: 08/996,921

[22] Filed: Dec. 23, 1997

[30] Foreign Application Priority Data

Dec. 24, 1996 [IT] Italy .................................. MI96A2740

[51] Int. Cl.[7] .................................................. H01L 29/788
[52] U.S. Cl. .......................... 257/316; 257/315; 257/317; 257/321
[58] Field of Search .................................... 257/315, 316, 257/317, 319, 321

[56] References Cited

U.S. PATENT DOCUMENTS

| Re. 35,094 | 11/1995 | Wu et al. ................................. | 438/264 |
|---|---|---|---|
| 3,914,857 | 10/1975 | Goser et al. ............................. | 438/144 |
| 5,081,054 | 1/1992 | Wu et al. ................................. | 438/258 |
| 5,411,904 | 5/1995 | Yamauchi et al. ...................... | 438/263 |
| 5,468,981 | 11/1995 | Hsu ......................................... | 257/316 |
| 5,491,101 | 2/1996 | Miyamoto et al. ..................... | 438/257 |
| 5,501,996 | 3/1996 | Yang et al. .............................. | 438/259 |
| 5,510,284 | 4/1996 | Yamauchi ............................... | 438/286 |
| 5,518,942 | 5/1996 | Shrivastava ............................ | 438/525 |
| 5,527,728 | 6/1996 | Ghezzi et al. .......................... | 438/264 |
| 5,567,632 | 10/1996 | Nakashiba et al. ..................... | 438/78 |
| 5,792,670 | 8/1998 | Pio et al. ................................. | 438/257 |
| 5,877,054 | 3/1999 | Yamauchi ............................... | 438/264 |
| 5,894,146 | 4/1999 | Pio et al. ................................. | 257/319 |

OTHER PUBLICATIONS

Six page article entitled An Asymmetrical Lightly Doped Source Cell for Virtual Ground High–Density EPROM's, by Kuniyoshi Yoshikawa, et al., IEEE Transactions on Electron Devices, vol. 37, No. 4, Apr. 1990.

Four page article entitled "Passivation Scheme Impact on Retention Reliability of Non Volatile Memory Cells," by R. Bottini, et al., 95 IRW Final Report, IEEE 1996.

*Primary Examiner*—David Hardy
*Assistant Examiner*—George C. Eckert, II
*Attorney, Agent, or Firm*—Jenkens & Gilchrist, P.C.; Theodore E. Galanthay

[57] ABSTRACT

A memory cell for devices of the EEPROM type, formed in a portion of a semiconductor material substrate having a first conductivity type. The memory cell includes source and drain regions having a second conductivity type and extending at the sides of a gate oxide region which includes a thin tunnel oxide region. The memory cell also includes a region of electric continuity having the second conductivity type, being formed laterally and beneath the thin tunnel oxide region, and partly overlapping the drain region, and a channel region extending between the region of electric continuity and the source region. The memory cell further includes an implanted region having the first conductivity type and being formed laterally and beneath the gate oxide region and incorporating the channel region.

13 Claims, 4 Drawing Sheets

MEMORY CELL FOR EEPROM DEVICES, AND CORRESPONDING FABRICATING PROCESS

FIELD OF THE INVENTION

This invention relates to a memory cell for devices of the EEPROM type, specifically of the FLOTOX EEPROM type, and to a CMOS process for fabricating it.

BACKGROUND OF THE INVENTION

As is known, there is an increasing demand from the market for EEPROM memory devices of ever larger capacity (>256 Kb). This implies a demand for ever smaller memory cells and, therefore, growing difficulty to ensure an acceptable level of reliability for such cells.

EEPROM memory devices are presently sold and guaranteed to operate properly for no less than 100,000 write/erase cycles. In terms of reliability, this means that the individual cells must inherently be of very high quality. This is more than a marginal conflicting requirement with the concurrent pressing demand for ever smaller physical size of the cells.

The persistent reduction in cell size indeed results, especially with submicron technologies, in the length L of the cell channel region becoming so small that an undesired harmful "punch-through" effect that is, in practice, the formation of a deep channel with a high parasitic current between the source and drain regions of the cell, is incurred.

FLOTOX EEPROM memory devices are at present the most widely employed memory devices by manufacturers throughout the world. These devices are formed of memory cells having two levels of polysilicon and a floating gate wherein an electric charge is stored to establish two different cell states-"written" or "erased," which correspond to the logic states of "1" or "0".

In particular, FIGS. 1 and 2 show the details of a FLOTOX EEPROM memory cell, indicated at 1, which is included in a memory device 2, itself formed on a semiconductor material substrate 10 having a first conductivity type, specifically of the P type. The device 2 further comprises a select transistor 3 connected in series with the cell 1.

Referring now to FIG. 1, it can be seen that the substrate 10 includes a source region 11 of the cell 1 which has a second conductivity type, specifically of the N type, and a region 12 of electrical continuity having the same conductivity type. This substrate also includes a drain region 13 of the cell 1 and a source region of the transistor 3 (the drain/source region 13) having the second conductivity type, specifically of the N type. The substrate 10 further includes a drain region of the transistor 3, also with the second conductivity type, specifically of the N type. All the regions indicated at 11–14 are facing a surface 15 of the substrate 10.

With further reference to FIG. 1, in stacked arrangement above the surface 15 are the following: a gate oxide region 18 of the cell 1, at the sides whereof are the source 11 and drain 13 regions of the cell, the region 18 having a thin tunnel oxide region 19 formed in it, a first portion 20 of a first polycrystalline silicon (poly1) layer, a first portion 21 of a dielectric (interpoly) layer, and a first portion 22 of a second (poly2) layer formed by polycrystalline silicon and tungsten silicide. The portions 20 and 22 form the floating gate region and control gate region, respectively, of the cell 1.

A portion of the substrate 10, indicated at 31 in FIG. 1, is included between the region 12 of electric continuity and the source region 11 of the cell 1 to form the cell channel region, whose length dimension is denoted by L.

It should be noted that the thin, approximately 80 Å thick, tunnel oxide region 19 is adapted to pass electric charges to the floating gate region by tunnel effect (a phenomenon also known as Fowler-Nordheim current), i.e., for programming the cell 1.

The region 12 of electric continuity, formed laterally and beneath the thin tunnel oxide region 19 and partly overlapping the drain region 13 of the cell 1, provides electric continuity between a portion of the substrate 10 underlying the region 19 (the so-called tunnel area) and the drain region 13.

With continued reference to FIG. 1, stacked on top of one another above the surface 15 are: a gate oxide region 25 of the select transistor 3, at the sides whereof are the source 13 and drain 14 transistor regions, a second portion 26 of poly1, a second portion 27 of the dielectric (interpoly) layer, and a second portion 28 of poly2. The portions 26 and 28 of the polycrystalline silicon layer are shortcircuited to a field oxide region, not shown in the drawings, outside the cell 1. An intermediate oxide layer 30 covers the device 2 and isolates the various layers from one another.

As can be seen in FIG. 2, the floating gate region (portion 20 of poly1) of the cell 1 is insulated and enclosed at the top and the sides by the dielectric interpoly layer 21, preferably an ONO layer formed of superposed silicon Oxide-silicon Nitride-silicon Oxide, and at the bottom by the gate oxide 18 and tunnel oxide 19 regions.

Still referring to FIG. 2, the region 12 of electric continuity and the channel region 31 (shown in FIG. 1) are bounded, laterally along their widths, by a thick field oxide layer 32.

Shown in FIG. 3 are the masks employed to form the memory cell 1. In detail, the reference numeral 4 denotes a capacitive implant mask for forming the region 12 of electric continuity, and the reference numeral 5 denotes a tunnel mask for forming the region 19.

Further in FIG. 3, the reference numeral 6 denotes a self-aligned etching mask (to be explained hereinafter), and the reference numeral 7 denotes a drain/source implant mask for forming the drain/source region 13. Finally, the reference numeral 8 denotes a mask for making the drain contact D for the select transistor 3.

The process for fabricating the memory cell 1 is a typical (two- or single-well) CMOS process.

Referring first to FIG. 4, and starting from the substrate 10, the capacitive implant mask 4 is formed after growing the field oxide 32, not shown in the Figure, to bound the active areas of the device 2 and grow a sacrificial oxide layer 39. This mask is formed using a layer 40 of a light-sensitive material to fully cover the sacrificial oxide layer 39 but for a window 41 through which the capacitive implantation (usually phosphorus for N-channel cells) will be effected to form the region 12 of electric continuity, as shown in FIG. 5.

Referring now to FIG. 5, after removing the mask 4 and the sacrificial oxide layer 39, a gate oxide layer 42 is grown to form the gate oxide region 18 of the cell 1. The tunnel mask 5 is then deposited, which comprises a layer 43 of a light-sensitive material fully covering the gate oxide layer 42 but for a window 45 where the thin tunnel oxide region 19 is to be formed.

Thereafter, a dedicated etching is applied to clean the surface 15, which results in the exposed portion of the layer 42 being etched away and the intermediate structure shown in FIG. 5 being produced.

Using the tunnel mask 5, the thin tunnel oxide region 19 is grown which is surrounded by the gate oxide layer 42, as shown in FIG. 6. The tunnel mask 5 is then removed to provide the intermediate pattern shown in FIG. 6. This is followed by the steps of:

depositing and doping the first (poly1) layer 44 of polycrystalline silicon, as shown in FIG. 7;

shaping layer 44 to delimit the width (along the horizontal direction in FIGS. 2 and 3) of the floating gate region 20 for the cell 1;

depositing the composite ONO (dielectric interpoly 21) layer;

back-etching the ONO layer 21 in the circuitry area of the device 2;

depositing and doping the poly2 layer;

self-alignment etching the poly2, ONO, poly1, and gate oxide 42 layers in the matrix, using the mask 6, to delimit the length (along the vertical direction in FIG. 3) of the floating gate 20 and control gate 22 regions of the cell 1 and simultaneously back-etching the poly2 and poly1 layers in the circuitry area to define the gates of transistors comprising the circuitry;

growing a protecting oxide layer (not shown because embedded within the dielectric layer 30) over the control gate region 22;

optionally effecting a first light drain/source implantation;

forming oxide portions, or spacers, not shown in the drawings, laterally of the floating gate 20 and control gate 22 regions; and effecting a drain/source implantation using the mask 7, to produce the regions 11, 13 and 14 and, therefore, the structure shown in FIGS. 1 and 2.

Subsequently, the following conventional final steps are carried out:

forming the intermediate dielectric layer 30 and the contacts, and defining the metal; and depositing the passivation layer.

What is needed is to provide a memory cell for EEPROM devices, specifically of the FLOTOX EEPROM type, which is more reliable than similar prior art devices.

Also, what is needed is to enhance the cell potential for scaling.

SUMMARY OF THE INVENTION

Accordingly, a memory cell for EEPROM devices is set forth. The memory cell is formed in a portion of a semiconductor material substrate having a first conductivity type and includes source and drain regions having a second conductivity type and extending at the sides of a gate oxide region which includes a thin tunnel oxide region. The memory cell further includes a region of electric continuity having the second conductivity type, being formed laterally and beneath the thin tunnel oxide region and partly overlapping the drain region, and a channel region included between the region of electric continuity and the source region. The memory cell further comprises an implanted region having the first conductivity type and being formed laterally and beneath the gate oxide region and incorporating the channel region, the implanted region being effective to increase the percentage of dopant in the portion of the substrate.

The present invention also provides an EEPROM memory device formed on a semiconductor material substrate having a first conductivity type. The memory device comprises a memory cell formed in a first portion of the substrate and a select transistor formed in a second portion of the substrate. The memory cell includes source and drain regions having a second conductivity type and extending at the sides of a gate oxide region including a thin tunnel oxide region. The memory cell also includes a region of electric continuity having the second conductivity type, being formed laterally and beneath the thin tunnel oxide region and partly overlapping the drain region, and a channel region included between the region of electric continuity and the source region. The memory cell further includes an implanted region having the first conductivity type extending laterally and beneath the gate oxide region and incorporating the channel region, the implanted region being effective to increase the percentage of dopant in the portion of the substrate.

The present invention also provides a process for fabricating a memory cell for an EEPROM device formed on a semiconductor material substrate having a first conductivity type, which device includes a select transistor connected in series to the memory cell, the memory cell and select transistor being formed in first and second portions, respectively, of the substrate. The memory cell includes source and drain regions having a second conductivity type and extending at the sides of a gate oxide region including a thin tunnel oxide region. The memory cell also includes a region of electric continuity having the second conductivity type, being formed laterally and beneath the thin tunnel oxide region and partly overlapping the drain region, and a channel region included between the region of electric continuity and the source region. The process comprises the steps of depositing a layer of a light-sensitive material onto the select transistor to form an implant mask, implanting, at a high energy, a dopant in the first portion of the substrate not covered by the implant mask, and forming an implanted region laterally and beneath the gate oxide region, incorporating the channel region, the implanted region being effective to increase the percentage of dopant in the portion of the substrate.

Additional objects, advantages, novel features of the present invention will become apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

BRIEF DESCRIPTION OF THE DRAWINGS

The features and advantages of a cell and process according to the invention will be apparent from the following description of an embodiment thereof, given by way of non-limitative example with reference to the accompanying drawings.

In the drawings.

DETAILED DESCRIPTION OF A PREFERRED EMBODIMENT OF THE INVENTION

Figure 2:
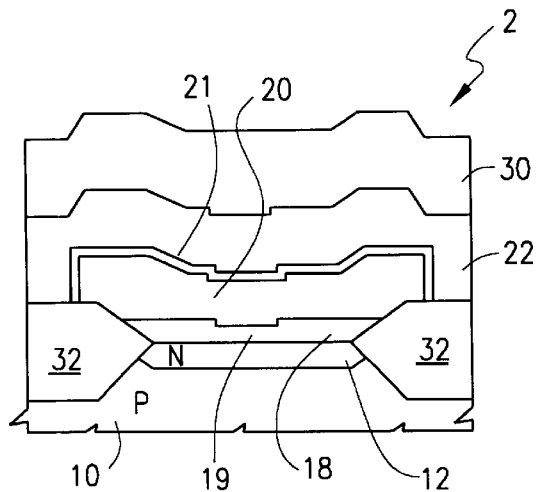
FIG. 2 is a cross-section through the prior art memory cell.
Figure 1:
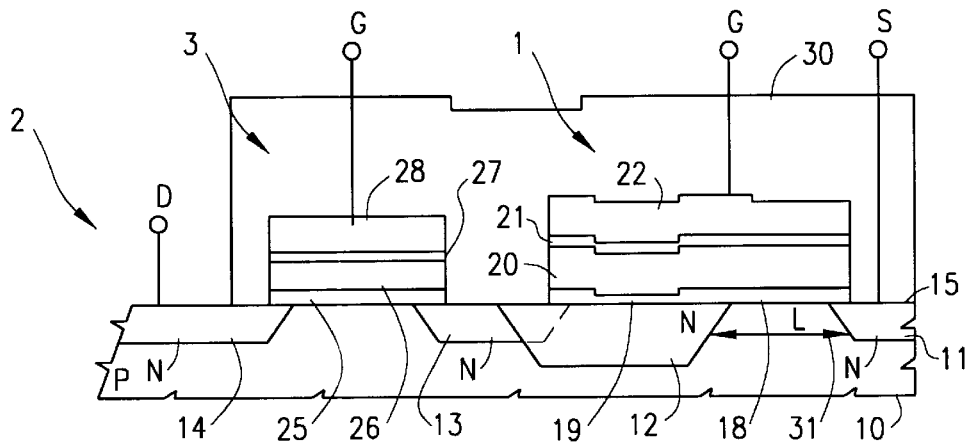
FIG. 1 is a cross-section through a device including the prior art memory cell.
Figure 3:
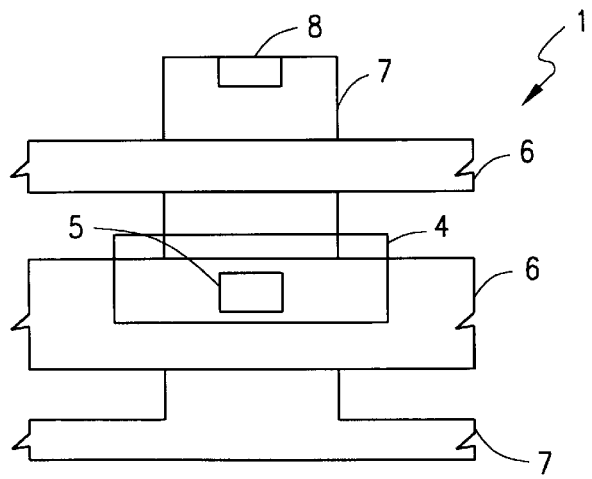
FIG. 3 is a plan view of certain masks used in fabricating an EEPROM cell according to the prior art.
Figure 4:
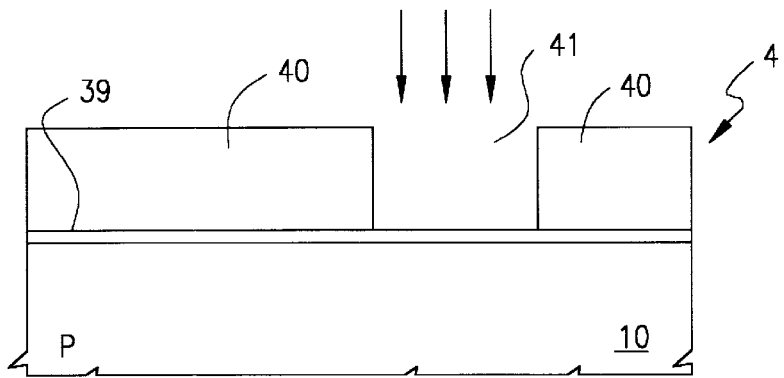
FIGS. 4–7 are cross-sectional views, similar to FIG. 1, of the prior art memory cell at different stages of its fabrication process.
Figure 5:
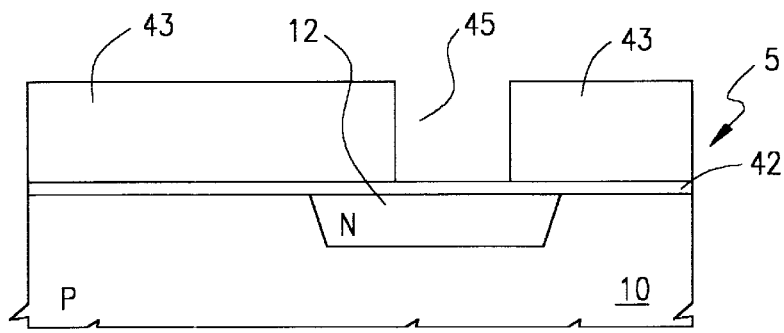
Figure 6:
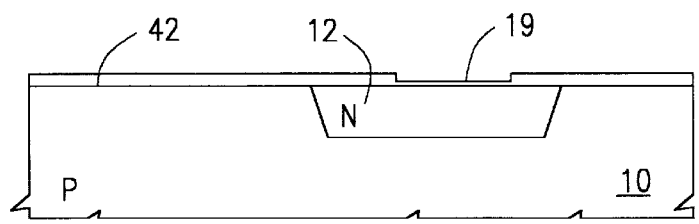

Referring to FIGS. 8–11, generally and schematically shown at 50 is a memory cell for EEPROM devices, specifically of the FLOTOX EEPROM type, which embodies this invention. Particularly, FIG. 11, which is similar to FIG. 1, shows the memory cell 50 included in a device 51 which it formed on a substrate 57 of a semiconductor material having a first conductivity type, in particular of the P type. The device 51 also comprises a select transistor, indicated at 52.

More particularly, the cell 50 and select transistor 52 are formed in series with each other, respectively within first 55 and second 56 portions of the substrate 57. The cell 50 and select transistor 52 are the same as conventional ones except for an implanted region 53 in the portion 55 of the substrate 57. This implanted region 53 is formed by the addition of a specific implant mask 54, shown in FIG. 10, to the conventional process steps previously described.

Figure 12:
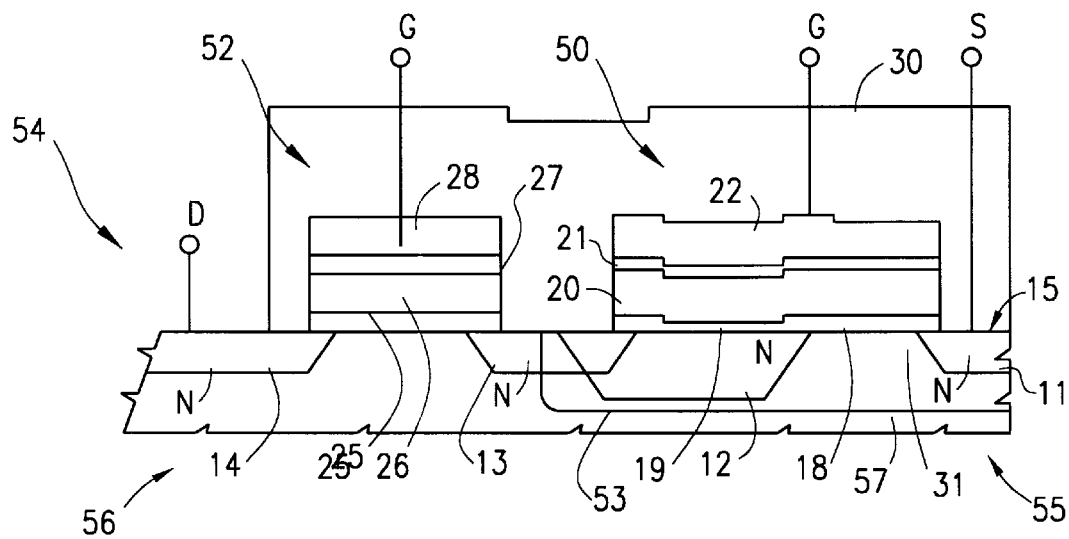
FIG. 12 is a cross-section view of a device having a memory cell according to an embodiment of the present invention.

For the rest, the other parts of the memory device 51, as well as the masks in common with the conventional memory device, carry the same reference numerals as previously used. In detail, the implanted region 53 is formed by implantation of the portion 55 with a dopant, usually boron. The implanted region 53 extends laterally and beneath the gate oxide region 18 and incorporates the channel region 31 of the cell. Furthermore, the implanted region 53 completely overlaps the source region 11 and region 12 of electric continuity, relative whereto it would be thicker and thinner, respectively. Also, the region 53 partly overlaps the drain region 13, relative whereto it would be thicker. Alternatively, the thickness of implanted region 53 may be greater than the thickness of the region 12 of electric continuity, as shown in FIG. 12.

This implanted region 53 is directed to bring the doping of the portion 55 of the substrate 57 to a given depth, so as to safeguard the channel region of the cell 50 front any punch through effects, i.e., the formation of the buried channel with a high parasitic current between the drain region 13 and source region 11.

Figure 7:
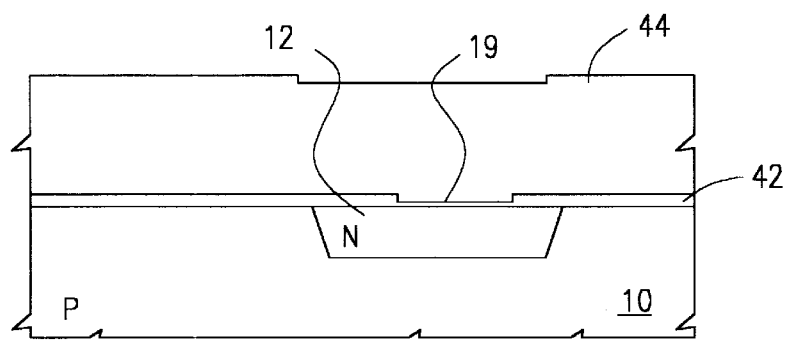

For fabricating the memory cell 50, a process is employed which comprises the same initial steps as the conventional process previously described, up to the deposition and doping of the first (poly1) layer 44 of polycrystalline silicon (FIG. 7) which, once suitably shaped, is to form the floating gate region of the cell.

Figure 8:
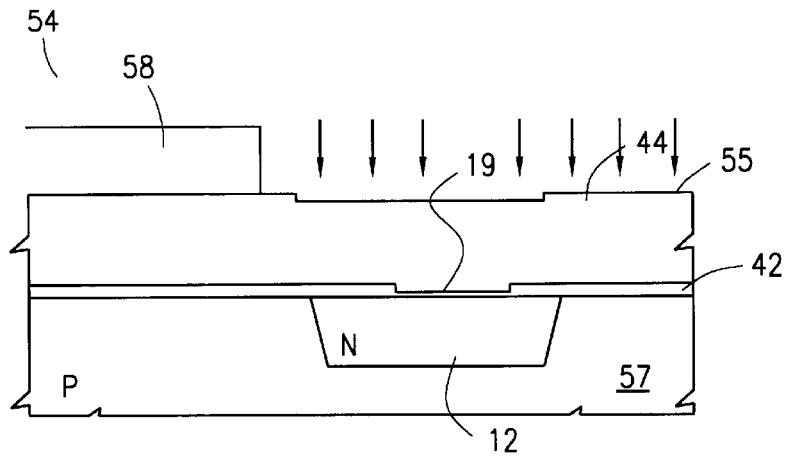
FIGS. 8 and 9 are cross-sectional views, similar to FIG. 1, of a memory cell, according to the present invention, shown at intermediate stages of its fabrication process.
Figure 9:
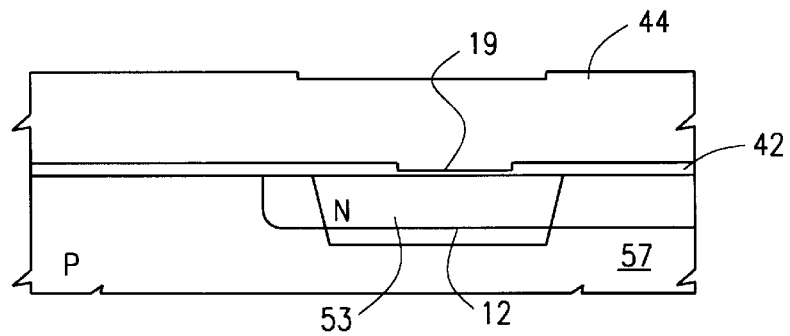
Figure 10:
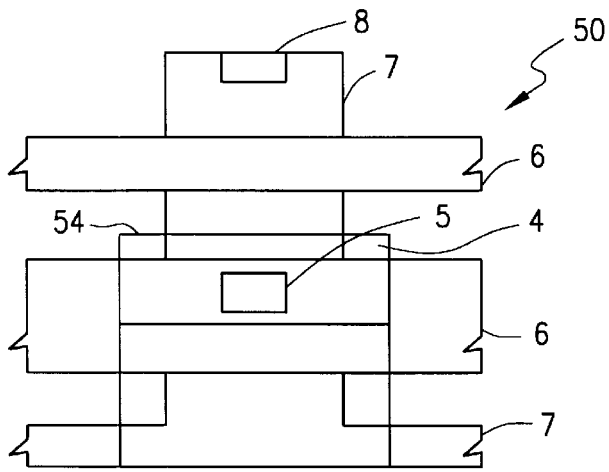
FIG. 10 is a plan view of certain masks used in fabricating a memory cell according to the present invention.
Figure 11:
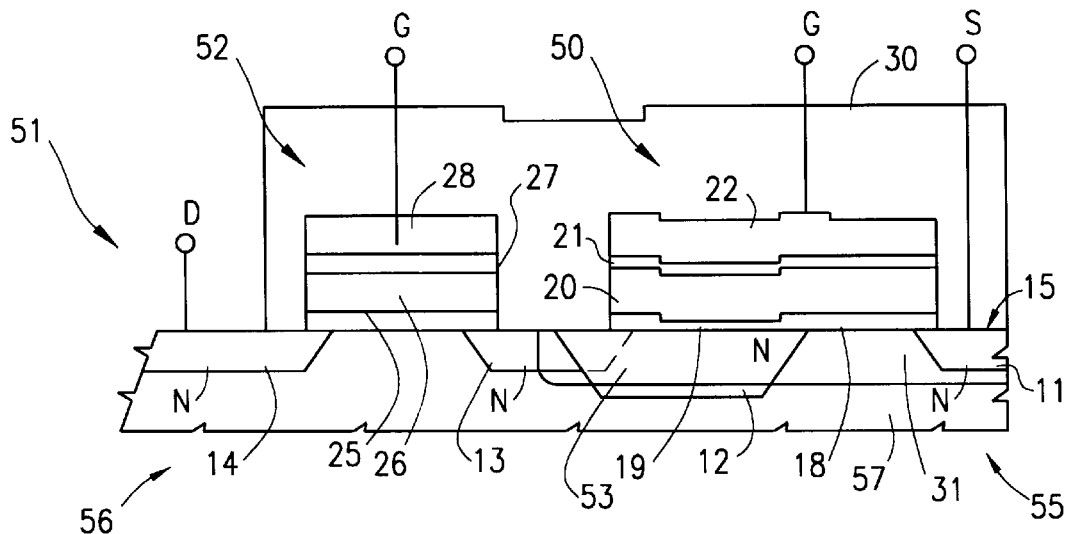
FIG. 11 is a cross-section through a device including a memory cell according to the present invention.

Thereafter, the process of this invention comprises the steps of:

depositing a layer 58 of a light-sensitive material onto the select transistor 52 to form the anti-punchthrough implant mask 54 (FIG. 8);

implanting boron in the portion 55 of the substrate 57 not covered by the mask 54, at an energy and to an amount appropriate to suppress the parasitic currents due to punch-through, but without affecting the threshold voltage of the cell 50 (FIG. 8); and forming the implanted region 53 (FIG. 9).

The process continues conventionally through the following steps:

forming the composite ONO (dielectric interpoly 21) layer;

depositing (and doping) the poly2 which is to provide the floating gate region of the cell 50, and so on in the standard manner.

In summary, by the invention described above, memory cells can be obtained which, for the same nominal size, exhibit improved protection against punchthrough effects, and hence, a higher potential for scaling and more reliable performance.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

We claim:

1. A memory cell for EEPROM devices, formed in a portion of a semiconductor material substrate having a first conductivity type, said memory cell comprising:

a gate oxide region defined over a portion of the semiconductor material and including a thin tunnel oxide region;

source and drain regions having a second conductivity type extending to the sides of the gate oxide region;

a region of electric continuity having the second conductivity type, being formed laterally and beneath the thin tunnel oxide region, and partly overlapping the drain region;

a channel region defined between the region of electric continuity and the source region; and an implanted region of the first conductivity type being formed laterally and beneath the gate oxide region and incorporating the channel region, said implanted region increases dopant levels in the portion of the semiconductor material substrate, the implanted region completely overlaps the region of electric continuity and has decreased thickness relative thereto.

2. The memory cell according to claim 1, wherein:

the implanted region completely overlaps the source region and has an increased thickness relative thereto.

3. The memory cell according to claim 1, wherein:

the implanted region partly overlaps the drain region and has an increased thickness relative thereto.

4. An EEPROM memory device formed in a semiconductor material substrate having a first conductivity type, said EEPROM memory device comprising:

a select transistor formed in a first portion of the semiconductor material substrate; and a memory cell formed in a second portion of the semiconductor material substrate, including:

a gate oxide region defined over the semiconductor material substrate and having a thin tunnel oxide region;

source and drain regions having a second conductivity type extending to the sides of the gate oxide region;

a region of electric continuity having the second conductivity type, being formed laterally and beneath the thin tunnel oxide region, and partly overlapping the drain region;

a channel region defined between the region of electric continuity and the source region; and an implanted region having the first conductivity type, extending laterally and beneath the gate oxide region, and incorporating the channel region, said implanted region increases dopant levels in the second portion of the substrate, said implanted region completely overlaps the region of electric continuity and has an increased thickness relative thereto.

5. The memory device according to claim 4, wherein:

the implanted region partly overlaps the drain region and has an increased thickness relative thereto.

6. A memory cell for an EEPROM device, formed in a portion of a semiconductor material substrate which has a first conductivity type, said memory cell comprising:

a gate oxide region on the portion of said semiconductor material, said gate oxide region comprising a thin tunnel oxide region;

a source/drain region, having a second conductivity type, extending from a side of said gate oxide region;

a region of electric continuity being formed laterally and beneath said thin tunnel oxide region, said region of electric continuity partially overlapping said source/drain region;

a channel region defined between said region of electric continuity and said source/drain region; and an implanted region having the first conductivity type and being formed laterally and beneath said gate oxide region, said implanted region completely overlapping said region of electric continuity.

7. The memory cell of claim 6, wherein said implanted region further has a thickness that is less than a thickness of said region of electric continuity.

8. The memory cell of claim 6, wherein said implanted region further has a thickness that is greater than a thickness of said region of electric continuity.

9. An EEPROM memory device formed in a semiconductor material substrate which has a first conductivity type, said EEPROM memory device comprising:

a transistor formed in a first portion of said semiconductor material substrate; and a memory cell formed in a second portion of said semiconductor material substrate, said memory cell including:

a gate oxide region over said semiconductor material substrate, said gate oxide region establishing a thin tunnel oxide region;

a source/drain region, having a second conductivity type, extending from at least one side of said gate oxide region;

a region of electric continuity, having said second conductivity type, being formed laterally and beneath said thin tunnel oxide region, said region of electric continuity partly overlapping said source/drain region; and an implanted region, having said first conductivity type, extending laterally and beneath said gate oxide region thereby incorporating said channel region, said implanted region increasing dopant levels in said second portion of said substrate, said implanted region completely overlapping said region of electric continuity and having a decreased thickness relative thereto.

10. The memory device according to claim 9, wherein said implanted region partially overlaps the source/drain region.

11. The memory device according to claim 10, wherein said implanted region has an increased thickness relative to said source/drain region.

12. The memory device according to claim 9, wherein said transistor and said memory cell share said source/drain region.

13. The memory device according to claim 9, wherein said transistor and said memory cell are connected in series.

* * * * *